(12) United States Patent
Hurkx et al.

(10) Patent No.: US 7,915,709 B2
(45) Date of Patent: Mar. 29, 2011

(54) SEMICONDUCTOR DEVICE AND METHOD OF MANUFACTURING THE SAME

(75) Inventors: Godefridus Adrianus Maria Hurkx, Eindhoven (NL); Prabhat Agarwal, Leuven (BE); Abraham Rudolf Balkenende, Eindhoven (NL); Petrus Hubertus Cornelis Magnee, Nijmegen (NL); Melanie Maria Hubertina Wagemans, Eindhoven (NL); Erik Petrus Antonius Maria Bakkers, Eindhoven (NL); Erwin Hijzen, Leuven (BE)

(73) Assignee: NXP B.V., Eindhoven (NL)

( * ) Notice: Subject to any disclaimer, the term of this patent is extended or adjusted under 35 U.S.C. 154(b) by 431 days.

(21) Appl. No.: 11/658,228

(22) PCT Filed: Jul. 7, 2005

(86) PCT No.: PCT/IB2005/052263
§ 371 (c)(1),
(2), (4) Date: Mar. 11, 2009

(87) PCT Pub. No.: WO2006/011069
PCT Pub. Date: Feb. 2, 2006

(65) Prior Publication Data
US 2009/0200641 A1 Aug. 13, 2009

(30) Foreign Application Priority Data
Jul. 20, 2004 (EP) .................................... 04103458

(51) Int. Cl.
*H01L 29/66* (2006.01)
*H01L 21/8222* (2006.01)

(52) U.S. Cl. ........... 257/565; 257/E21.37; 257/E29.174; 438/309; 977/936

(58) Field of Classification Search .................. 257/565, 257/20, 77, E21.37, E29.174, 197, 552; 438/309, 438/257, 551, 317; 977/762, 815, 843, 854, 977/891, 932, 936, 700
See application file for complete search history.

(56) References Cited

U.S. PATENT DOCUMENTS
5,340,753 A * 8/1994 Bassous et al. ............... 438/366
(Continued)

FOREIGN PATENT DOCUMENTS
WO WO2004/040668 * 5/2004

OTHER PUBLICATIONS
Lauhon et al., "Semiconductor nanowire heterostructures", 2004, Phil. Trans. R. Soc. Lond. vol. A 362, pp. 1247-1260, Apr. 8, 2004.*

*Primary Examiner* — Thomas L Dickey
*Assistant Examiner* — Nikolay Yushin (57) ABSTRACT

The invention relates to a semiconductor device (10) with a semiconductor body (12) comprising a bipolar transistor with an emitter region, a base region and a collector region (1, 2, 3) of, respectively, a first conductivity type, a second conductivity type opposite to the first conductivity type, and the first conductivity type. One of the emitter or collector regions (1, 3) comprises a nanowire (30). The base region (2) has been formed from a layer (20) at the surface of the semiconductor body (12); the other one (3, 1) of the emitter or collector regions (1, 3) has been formed in the semiconductor body (12) below the base region (2). The emitter or collector region (1, 3) comprising the nanowire (30) has been provided on the surface of the semiconductor body (12) such that its longitudinal axis extends perpendicularly to the surface.

20 Claims, 9 Drawing Sheets

U.S. PATENT DOCUMENTS

| | | | |
|---|---|---|---|
| 5,389,798 A * | 2/1995 | Ochi et al. | 257/25 |
| 2002/0130311 A1* | 9/2002 | Lieber et al. | 257/1 |
| 2002/0175408 A1* | 11/2002 | Majumdar et al. | 257/734 |
| 2004/0046233 A1* | 3/2004 | Swanson et al. | 257/565 |
| 2004/0075464 A1* | 4/2004 | Samuelson et al. | 326/37 |
| 2005/0224888 A1* | 10/2005 | Graham et al. | 257/368 |
| 2007/0108435 A1* | 5/2007 | Harmon et al. | 257/9 |

* cited by examiner

SEMICONDUCTOR DEVICE AND METHOD OF MANUFACTURING THE SAME

The invention relates to a semiconductor device comprising a semiconductor body with a bipolar transistor comprising an emitter region, a base region and a collector region of, respectively, a first conductivity type, a second conductivity type opposite to the first conductivity type, and the first conductivity type, wherein a nanowire is used to form one of the emitter, base and collector regions. In this application, the term "nanowire" is to be taken to mean a body of which at least one lateral dimension lies in the range between 0.5 nm and 100 nm, more particularly between 1 and 50 nm. Preferably, dimensions of the nanowire in two lateral directions lie in said ranges. Such lateral dimensions cannot, or at least not easily, be achieved by means of photolithography, while such dimensions are desirable, inter alia, in connection with the ongoing miniaturization in the IC (=Integrated Circuit) technology. In this connection, besides component density, also speed, breakdown voltage and current and/or power consumption of the semiconductor elements, in this case the bipolar transistor(s), play a very important role.

Such a device and such a method are known from the publication "Functional Nanoscale Electronic Devices Assembled Using Silicon Nanowire Building Blocks" by Yi Cui and Charles M. Lieber, published in Science vol. 291, 2 Feb. 2001, pp. 851-853. In said document a description is given of a bipolar transistor formed by means of three nanowires of silicon having, respectively, the n-conductivity type, the p-conductivity type and the n-conductivity type. Said nanowires are formed by means of separation from a liquid phase.

A drawback of the known device and the known method resides in that they are not fully compatible with modern IC technology. Integration with other semiconductor elements, and the provision of a large number of transistors on a small surface area are not easy.

Therefore, it is an object of the present invention to provide a device and a method which are very compatible with the current IC technology and are suitable for integration and high component densities, and which, in addition, have very small dimensions and exhibit a low current and/or power consumption.

To achieve this, a device of the type mentioned in the opening paragraph is characterized in accordance with the invention in that one of the emitter or collector regions comprises a nanowire, the base region is formed at the surface of the semiconductor body by means of a layer-shaped region, the other one of the emitter or collector regions is formed in the semiconductor body below the base region, and the emitter or collector region comprising the nanowire is provided on the surface of the semiconductor body in such a manner that the longitudinal axis thereof extends perpendicularly to the surface of the semiconductor body. In this manner, a device is achieved, of which a large part, i.e. two of the three emitter, base and collector regions, can be excellently manufactured by means of conventional IC technology. The invention is based on the recognition that if only the emitter, or only the collector, comprises a nanowire, both integration and reduction of lateral dimensions is possible to a sufficient degree and in a manner that is far superior to photolithographic techniques. The dimensions of the emitter, or of the collector in the case of a so-termed inverted bipolar transistor, are the paramount factors in the case of miniaturization. After all, as use is made of self-registering techniques, the lateral dimensions of the wire, along with other factors, determine also the dimensions of the other parts. In addition, the invention is based on the recognition that a nanowire oriented perpendicularly to the surface is most suited for the formation of the emitter (or collector) or for an auxiliary body by means of which the emitter (or collector) is formed. Finally, the invention is based on the recognition that all of the above can be readily achieved by means of a method in accordance with the invention, and that such a method is also very compatible with the current IC technology and the envisaged future IC technology.

In an important embodiment, the base region is formed by means of an epitaxial layer provided on a substrate, which epitaxial layer contains a mixed crystal of silicon and germanium. Such a technique can very suitably be used to form a layer-shaped base region. In addition, the base region can thus be readily provided with a smaller bandgap by forming a mixed crystal of silicon and germanium in said base region. Besides particularly small emitter (or collector) dimensions, such a reduction of the bandgap is very important to obtain, in particular, high-frequency bipolar transistors. In addition, such a SiGe-containing material offers an improved and, by virtue of the Ge-content, adjustable possibility of adapting the lattice constant of the base region as adequately as possible to that of the emitter (or collector) region in the case that a III-V material has been chosen for said region.

In a preferred embodiment, the nanowire is formed by means of selective epitaxy. Such a process is highly compatible with the current IC technology. The nanowire for the emitter may contain, for example, polycrystalline silicon, which is provided with the proper doping elements. By outdiffusion of those elements from the nanowire now serving as an auxiliary body, the actual emitter can be readily formed in the layer-shaped base region. Preferably, the nanowire contains a semiconductor material. If so, it is possible, for example if the semiconductor material is monocrystalline, to also form a heterojunction between the emitter region and the base region. In particular a III-V semiconductor material is suitable for this purpose.

By virtue thereof, an emitter region of a material having a large bandgap may be applied in the transistor. In spite of lower DC (=Direct Current) settings and hence lower current densities, the cut-off frequency of such a transistor may still be high. This low current density multiplied by the small surface of the emitter—corresponding to the lateral dimensions of the nanowire—enables a fast transistor to be formed having a low current consumption and hence a low power consumption. In an attractive modification thereof, the composition of the III-V material varies in the longitudinal direction of the nanowire. Near the base region, the nanowire may contain, for example, GaP, which is a material having a very large bandgap. At a location closer to the upper part of the nanowire use can be made of, for example, InP, which is a material having a smaller bandgap but a much higher electron mobility, enabling a low series resistance. It is also possible to choose a different material for the upper part of the nanowire with a view to enabling low-ohmic contacting thereof. For these or other reasons, it is alternatively possible in these or other embodiments to advantageously apply a gradient in the doping concentration in the nanowire.

Although III-IV materials, in particular the ternary and quaternary systems, make it possible to provide the lattice constant of the material with a more desirable value, a factor that also plays a part in the case of variants of the invention which center on the use of III-V materials is the insight that just because of the small lateral dimensions of a nanowire, problems related to non-matching crystal lattices, such as the development of defects, do not play a part at all or to a smaller degree.

In a further preferred embodiment of a semiconductor device in accordance with the invention, the nanowire is provided with a spacer, and the base region is formed so as to be self-aligning with respect to the nanowire provided with the spacer. By virtue thereof, a bipolar transistor is possible, wherein the position of the nanowire-forming-the-emitter with respect to so-termed oxide windows is no longer important for the transistor behavior. In addition, the junction between the base region and the collector region can be very small. Moreover, if necessary, a plurality of transistors can be formed in parallel by growing a plurality of nanowires in a region.

An important embodiment is therefore characterized in that the emitter region comprises a large number of separate nanowires whose end portions, which are removed from the surface of the semiconductor body, are interconnected by means of a conductor.

In a further favorable modification, the nanowire comprises a metal, such as aluminum or copper. This enables an emitter connection having a very low resistance to be formed. Particularly in the case of the very small lateral dimensions of a nanowire, such a low resistance is of crucial importance. The emitter is preferably formed, in this case, by first forming a doped, polycrystalline nanowire and, subsequently, after the formation by means of out-diffusion of an emitter region which is recessed in the base region, removing the poly-nanowire, which is provided with a spacer or which is recessed in an insulating layer, by means of (selective) etching, after which the nano-cavity thus formed can be filled with the metal. This option may also be very attractive if the nanowire contains a III-V material. After all, such materials are composed of elements which form a doping element for silicon. Phosphor or arsenic from, for example, InP or GaAs could be diffused from the nanowire into the base region to form an emitter region which is recessed therein. In a further modification, the polycrystalline nanowire is converted into a higher conductivity material by reacting it with another material. In this way, polycrystalline silicon may be converted into a metal silicide by means of a metal provided on said polycrystalline silicon.

As mentioned hereinabove, the device in accordance with the invention may also comprise a so-termed inverted bipolar transistor. In that case, the collector region comprises the nanowire. Such a transistor has the advantages, as compared to a "normal" transistor, that the collector-base junction has a small surface and hence the associated depletion capacitance is small, and, in addition, that the emitter connection is situated on the lower side of the semiconductor body and hence can be formed by means of a surface-mounting technique, with or without the use of so-termed "bumps", instead of a wire connection. By using, in particular, III-V nanowire to form the collector, the following additional advantages are achieved. The collector-base capacitance is very low. The collector can advantageously comprise a material having a large bandgap. In such a material, a higher, critical electric field is possible, as a result of which the breakdown voltage may be much higher than in the case of a collector of silicon. A device in accordance with the invention may of course comprise both types of transistors, i.e. one or more "normal" transistors, wherein the emitter region contains a nanowire, as well as one or more inverted transistors, wherein the collector region comprises a nanowire.

A method of manufacturing a semiconductor device with a semiconductor body in which a bipolar transistor is formed comprising an emitter region, a base region and a collector region of, respectively, a first conductivity type, a second conductivity type opposite to the first conductivity type, and the first conductivity type, is characterized in accordance with the invention in that one of the emitter and collector regions is formed by means of a nanowire, the base region is formed at the surface of the semiconductor body by means of a layer-shaped region, the other one of the emitter and collector regions is formed under the base region in the semiconductor body, and the emitter or collector region formed by means of the nanowire is provided on the surface of the semiconductor body in such a way that its longitudinal axis extends perpendicularly to the surface.

By means of such a method, a device in accordance with the invention is readily obtained.

In a preferred embodiment of a method in accordance with the invention, after the formation of the layer-shaped region by means of which the base region is formed, a flat metal region is locally provided on the surface of the semiconductor body, which flat metal region, after melting, forms into a droplet-shaped metal region, after which the nanowire is grown under the droplet-shaped metal region, on the surface of the semiconductor body, by means of a gas-phase growth process. This method can very suitably be combined with the existing IC technology. To locally form a droplet-shaped metal region, use can alternatively be made of another method employing, for example, a colloidal solution of a metal (compound).

Preferably, after the formation of the nanowire, said wire is provided with a spacer. By virtue thereof, the base and emitter region can be formed in a self-aligning manner. In a favorable modification thereof, the nanowire provided with the spacer is buried by means of a first isolating layer, after which the structure is planarized, thereby causing the droplet-shaped metal region to be removed. This method is very suitable for the further processing of the device in order to obtain a device which is ready for final assembly. The undesirable, droplet-shaped metal region is removed automatically during said processing and hence a separate process step is not required, which is advantageous of course.

In a further modification, a conductive region of larger section than the nanowire is subsequently formed on the exposed end portion of the nanowire, after which a second isolating layer is applied to the structure and provided with apertures extending as far as the base region, after which the conductive region and the apertures are filled using a conductive material. A device suitable for final assembly is thus obtained. In addition, the conductive region can be readily connected to a large number of emitter nanowires, which jointly form the emitter of the transistor.

In a very attractive method for said last-mentioned, parallel modification, the nanowire provided with a spacer serves as a mask to remove the part of the layer-shaped base region situated outside the mask by means of etching. In this method, by means of oxidation and etching, the side faces of the base region can be exposed and a surface insulation layer present can be extended, viewed in projection, as far as the base region, after which a conductive layer is provided so as to be in contact with the side faces of the base region. In this manner, a very compact device is obtained which combines a very high component density with very small parasitic capacitances, which results in a device having a higher velocity. The small lateral dimensions of the nanowire are projected, as it were, on the semiconductor body so as to make the other regions of the transistor compact too.

These and other aspects of the invention are apparent from and will be elucidated with reference to the embodiment(s) described hereinafter.

In the drawings.

The Figures are not drawn to scale, and some dimensions are exaggerated for clarity. Corresponding regions or parts are indicated by means of the same hatching and the same reference numerals, whenever possible.

Figure 1:
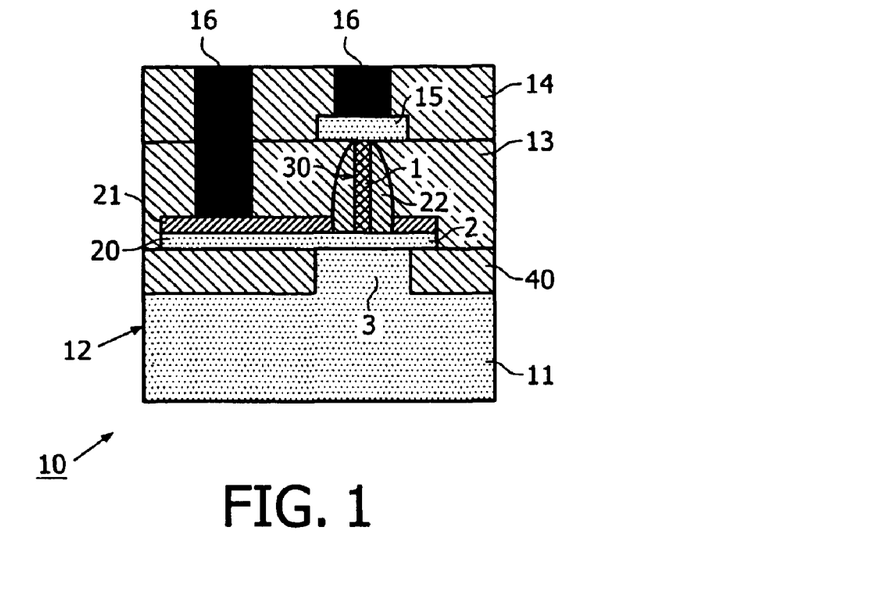
FIG. 1 is a diagrammatic, cross-sectional view, at right angles to the thickness direction, of an embodiment of a semiconductor device in accordance with the invention, FIG. 2 diagrammatically shows, in a cross-sectional view, at right angles to the thickness direction, the device of FIG. 1 in a first stage of the manufacturing process by means of a first embodiment of a method in accordance with the invention, FIG. 3 diagrammatically shows, in a cross-sectional view, at right angles to the thickness direction, the device of FIG. 1 in a successive stage after the stage of FIG. 2, of the manufacturing process by means of a first embodiment of a method in accordance with the invention, FIG. 4 diagrammatically shows, in a cross-sectional view, at right angles to the thickness direction, the device of FIG. 1 in a successive stage after the stage of FIG. 3, of the manufacturing process by means of a first embodiment of a method in accordance with the invention, FIG. 5 diagrammatically shows, in a cross-sectional view, at right angles to the thickness direction, the device of FIG. 1 in a successive stage after the stage of FIG. 4, of the manufacturing process by means of a first embodiment of a method in accordance with the invention, FIG. 6 diagrammatically shows, in a cross-sectional view, at right angles to the thickness direction, the device of FIG. 1 in a successive stage after the stage of FIG. 5, of the manufacturing process by means of a first embodiment of a method in accordance with the invention, FIG. 7 diagrammatically shows, in a cross-sectional view, at right angles to the thickness direction, the device of FIG. 1 in a successive stage after the stage of FIG. 6, of the manufacturing process by means of a first embodiment of a method in accordance with the invention, FIG. 8 diagrammatically shows, in a cross-sectional view, at right angles to the thickness direction, the device of FIG. 1 in a successive stage after the stage of FIG. 7, of the manufacturing process by means of a first embodiment of a method in accordance with the invention, FIG. 9 diagrammatically shows, in a cross-sectional view, at right angles to the thickness direction, the device of FIG. 1 in a successive stage after the stage of FIG. 8, of the manufacturing process by means of a first embodiment of a method in accordance with the invention, FIG. 10 diagrammatically shows, in a cross-sectional view, at right angles to the thickness direction, the device of FIG. 1 in a successive stage after the stage of FIG. 9, of the manufacturing process by means of a first embodiment of a method in accordance with the invention, FIG. 11 diagrammatically shows, in a cross-sectional view, at right angles to the thickness direction, the device of FIG. 1 in a successive stage after the stage of FIG. 10, of the manufacturing process by means of a first embodiment of a method in accordance with the invention, FIG. 12 diagrammatically shows, in a cross-sectional view, at right angles to the thickness direction, the device of FIG. 1 in a successive stage after the stage of FIG. 11, of the manufacturing process by means of a first embodiment of a method in accordance with the invention, FIG. 13 diagrammatically shows, in a cross-sectional view, at right angles to the thickness direction, the device of FIG. 1 in a successive stage after the stage of FIG. 12, of the manufacturing process by means of a first embodiment of a method in accordance with the invention, FIG. 14A diagrammatically shows, in a plan view, the device of FIG. 1 in a first successive stage of the manufacturing process by means of a first embodiment of a method in accordance with the invention, FIG. 14B diagrammatically shows, in a plan view, the device of FIG. 1 in a successive stage, after the stage of FIG.14A, of the manufacturing process by means of a first embodiment of a method in accordance with the invention, FIG. 14C diagrammatically shows, in a plan view, the device of FIG. 1 in a successive stage, after the stage of FIG.14A, of the manufacturing process by means of a first embodiment of a method in accordance with the invention.

FIG. 1 is a diagrammatic cross-sectional view, at right angles to the thickness direction, of a first embodiment of a semiconductor device 10 comprising a bipolar transistor in accordance with the invention. The device 10 of this example comprises (see FIG. 1) a substrate 11, in this case an n-type silicon substrate, on which a layer-shaped p-type semiconductor region 20 is present, which forms a base region 2 of the transistor containing, in this case, a mixed crystal of SiGe (Ge content of approximately 25 at. %) and having a thickness of approximately 20 nm. The layer-shaped semiconductor region 20 (partly) covers insulation regions 40, here in the form of a so-termed trench insulation, which are recessed in the semiconductor body 12. A part of the semiconductor body 12 situated between the regions 40 serves as a collector region 3 of the transistors. On top of the base region 2 there is an emitter region 1 of the transistor which, in this case, comprises a nanowire 30 of a III-V semiconductor material having a diameter of approximately 10 nm and a height of 100 nm. Around said emitter region 1 there is a spacer 22, in this case of silicon dioxide, having a width of approximately 10 nm. Outside said spacer, the layer-shaped region 20 is provided with a metal silicide layer 21, such as platinum silicide, which serves as a connection region for the base region 2. The transistor formed so far is provided with a first electrically insulating layer 13, in this case of silicon dioxide.

On top thereof, a polycrystalline silicon connection region 15 for the emitter 1 is formed. Above said emitter connection region there is a second electrically insulating layer 14, in this case also of silicon dioxide. Above the emitter connection region 15 and the base connection region 21, apertures are formed in the insulating layer(s) 13, 14, which are filled with a conductive material 16, for example a metal such as aluminum or copper. The substrate region 3 may of course also be a so-termed n-well formed in a p-type silicon substrate. The device 10 of this example can be manufactured in the manner described hereinbelow, by means of a first embodiment of a method in accordance with the invention.

Figure 2:
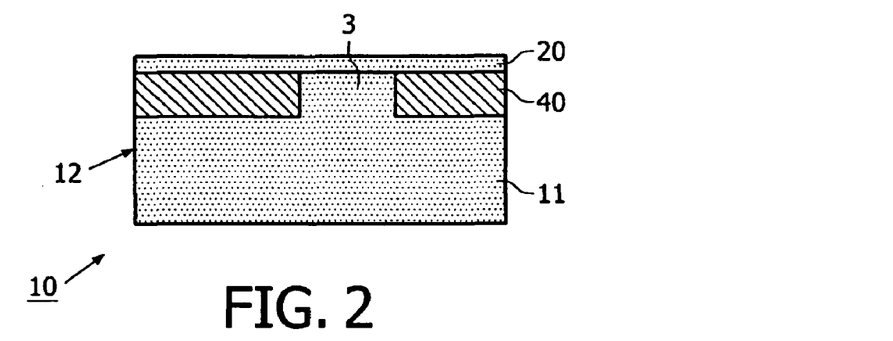
Figure 14A:
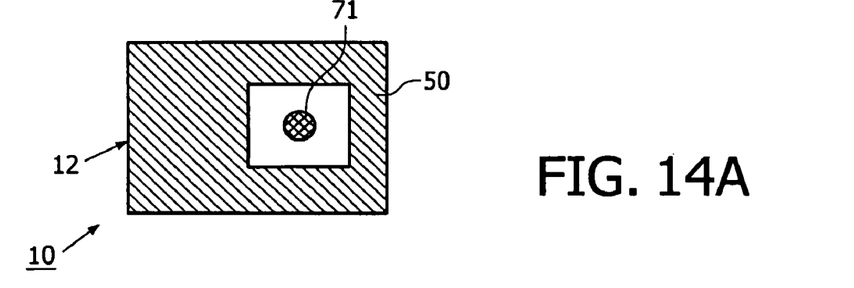
Figure 14B:
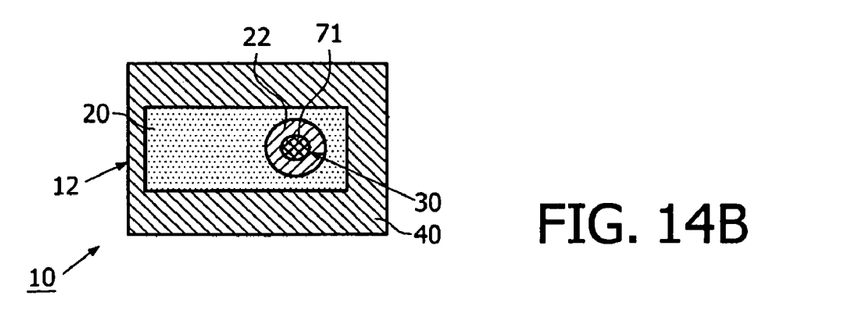
Figure 14C:
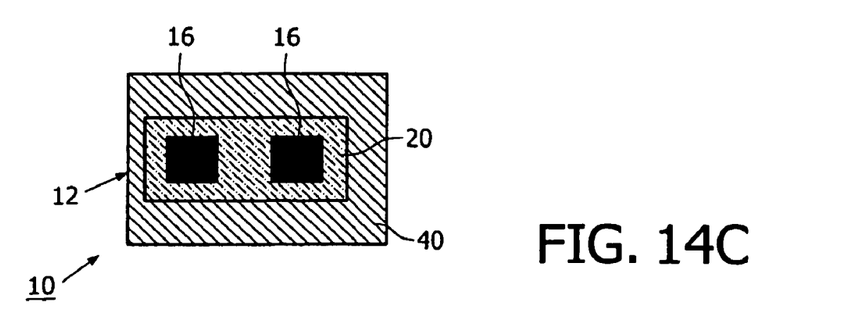

FIGS. 2 through 14 diagrammatically show, in a cross-sectional view, at right angles to the thickness direction, or, like in FIGS. 14-A-C, in a plan view, the device of FIG. 1 in successive stages of the manufacturing process by means of a first embodiment of a method in accordance with the invention. An n-type substrate 11 of silicon is used as the starting material (see FIG. 2). In said substrate, insulation regions 40 of silicon dioxide are formed. An epitaxial layer 20 of SiGe is then provided on this structure by means of gas-phase epitaxy, said epitaxial layer being polycrystalline above the insulation regions 40 and monocrystalline between said insulation regions.

Figure 3:
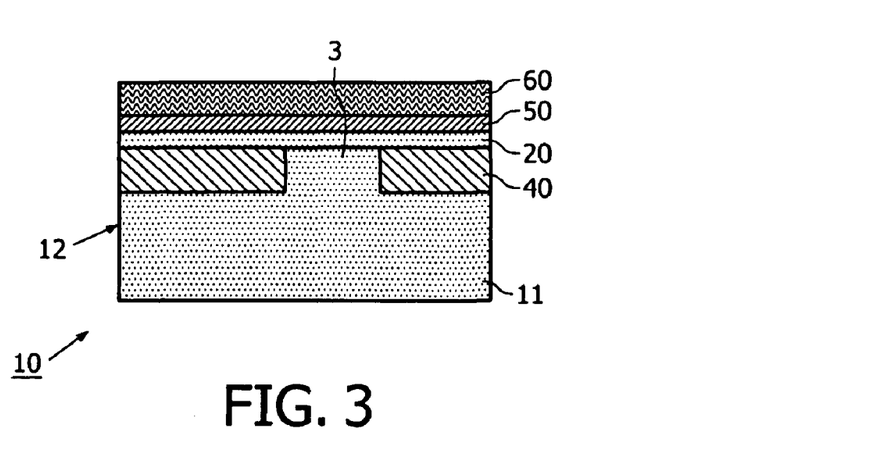

Subsequently (see FIG. 3), an insulating layer 50, in this case of silicon dioxide, is provided by means of, in this example, CVD (=Chemical Vapor Deposition) on the SiGe layer 20. A photoresist layer 60 is provided on top of said insulating layer.

Figure 4:
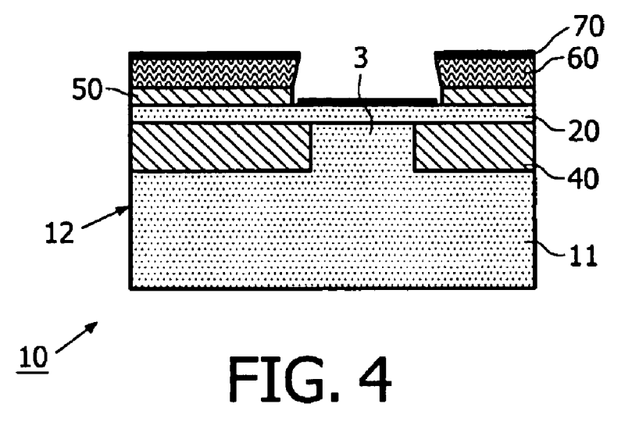

The resist layer 60 is patterned by means of photolithography (see FIG. 4), after which the insulating layer is locally removed in the opening in the resist layer 60 by means of etching. Subsequently, a metal layer, in this case a 10 nm thick Au layer 70, is provided, in this case by means of vaporization, on the resultant structure.

Figure 5:
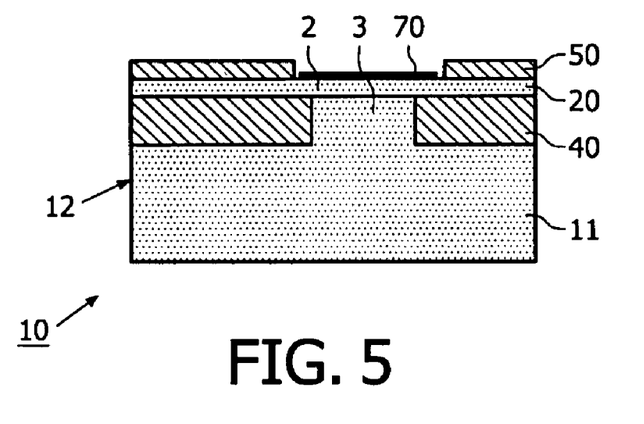

Next (see FIG. 5), a lift-off process, in which the resist layer 60 is removed, is applied to remove the parts of the Au layer 70 which are situated on top of the resist layer 60. As a result, the Au layer 70 is only present directly on the SiGe layer 20.

Next (see FIG. 6), the remaining part of the Au layer 70 is melted by exposure to heat, in which process a droplet-shaped area 71 of Au forms at an increased temperature. In this example, a small quantity of silicon is dissolved therein.

Subsequently (see FIG. 7), a nanowire 30, in this case of InP, is grown on the SiGe layer 20 by means of a gas-phase growth process. In said process, the droplet-shaped metal region 71 is lifted as it were, as a result of which it is situated on top of the nanowire 30.

Figure 7:
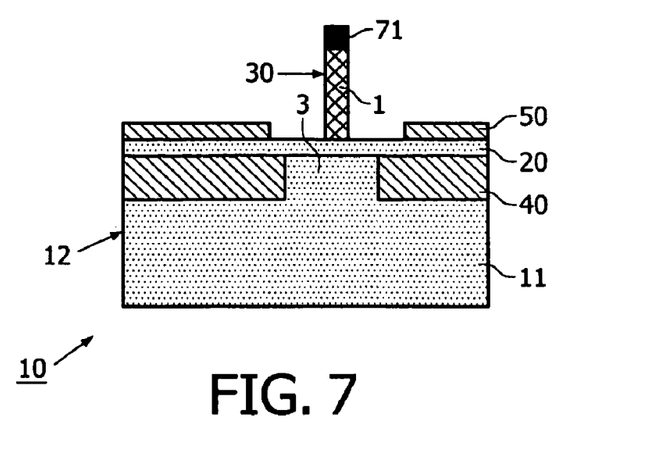

Said wire 30 forms the emitter region 1 of the transistor to be formed.

Figure 8:
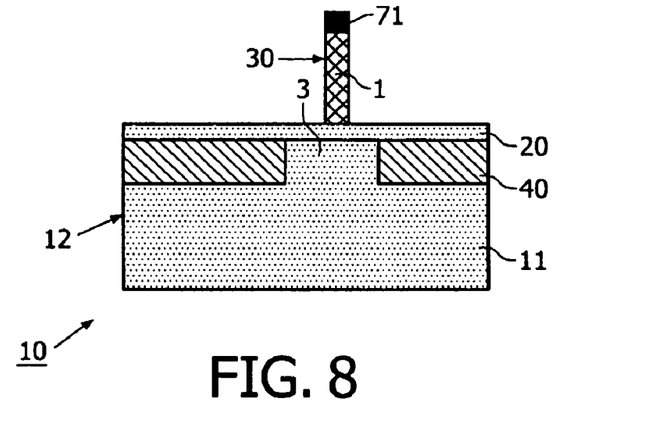
Figure 9:
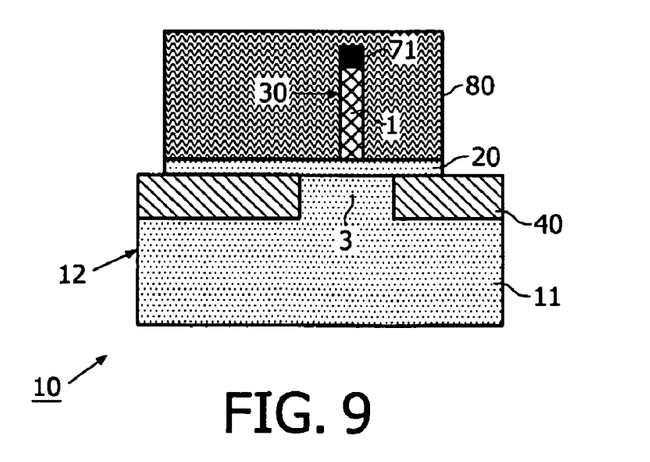

Subsequently (see FIG. 8), the remaining parts of the insulating layer 50 are removed by means of etching and (see FIG. 9) a further photoresist layer 80 is provided over the structure and patterned by means of photolithography. The superfluous parts of the semiconductor layer 20 are subsequently removed by means of etching.

After the removal, (see FIG. 10), of the further resist layer 80, a thin insulating layer is provided over the structure. This layer is subsequently largely removed again by means of anisotropic etching, the remaining parts thereof, which extend at right angles to the surface, being used to form the spacer 22 which surrounds the nanowire 30. Next, the part of the p-type, layer-shaped region 20 of SiGe situated outside nanowire 30 and spacer 22 is provided with a higher (p-type) doping concentration by means of an ion implantation 100.

Figure 11:
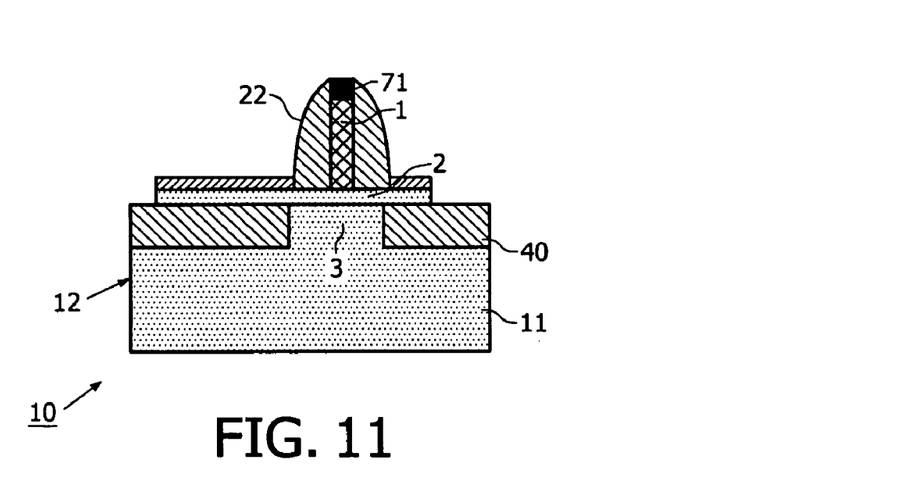

Subsequently (see FIG. 11), a metal layer, for example of nickel or platinum, is applied, for example by means of sputtering. By exposure to heat, this layer is reacted with the semiconductor layer 20, causing a metal silicide 21 to be formed.

Next (see FIG. 12), a first electrically insulating layer 13 is provided over the structure, after which a planarization step by means of CMP (=Chemical Mechanical Polishing) is carried out. In this example, also the droplet-shaped metal region 71 above the nanowire 30 is removed in this planarization step.

Subsequently (see FIG. 13), a polycrystalline silicon connection region 15 is formed which electrically contacts the nanowire 30 and which has larger lateral dimensions than said nanowire 30. This is achieved, in this case, by applying a uniform layer of doped poly Si, which is subsequently patterned by means of photolithography and etching.

Finally (see FIG. 1), a second electrically insulating layer 14 of silicon dioxide is provided. In said insulating layer, channel-shaped apertures are formed which run to the silicide region 21 and to the connection region 15, which apertures are filled with a metal 16, such as aluminum or copper.

Figure 6:
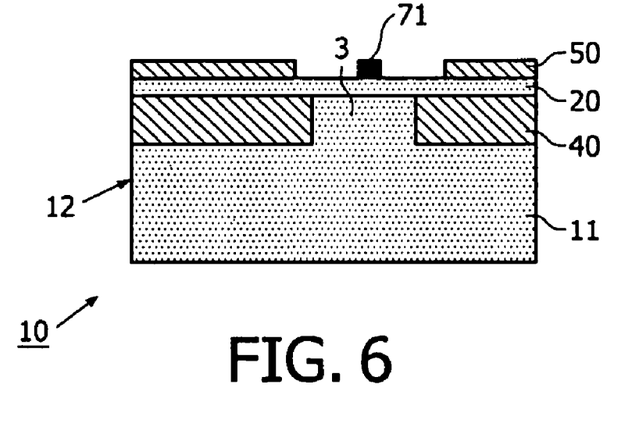
Figure 10:
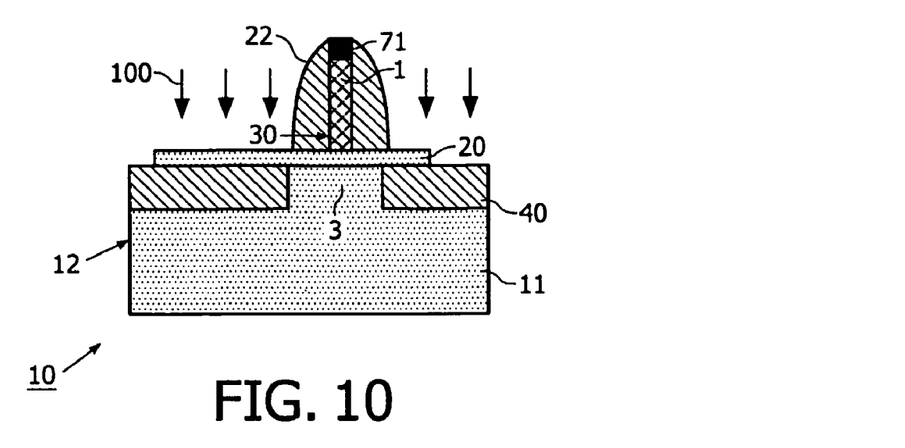

FIG. 14 shows, for the sake of completeness, a few stages in the manufacturing process in a plan view. FIG. 14A shows the stage that corresponds to FIG. 6, FIG. 14B shows the stage that corresponds to FIG. 10, and FIG. 14C shows the (final) stage that corresponds to FIG. 1.

Figure 15:
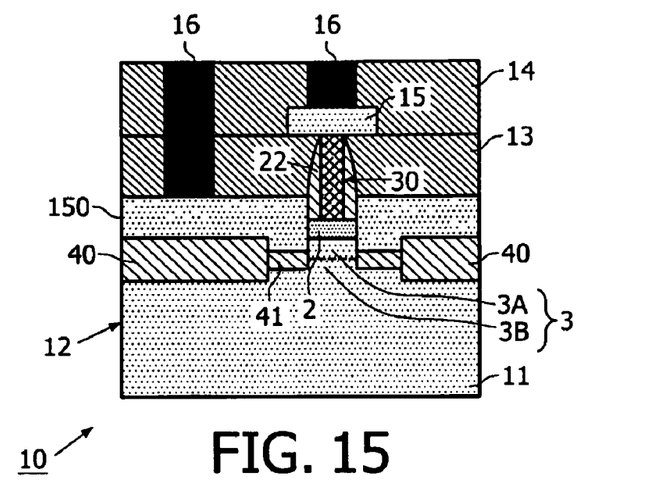
FIG. 15 is a diagrammatic, cross-sectional view, at right angles to the thickness direction, of a second embodiment of a semiconductor device in accordance with the invention.
Figure 16:
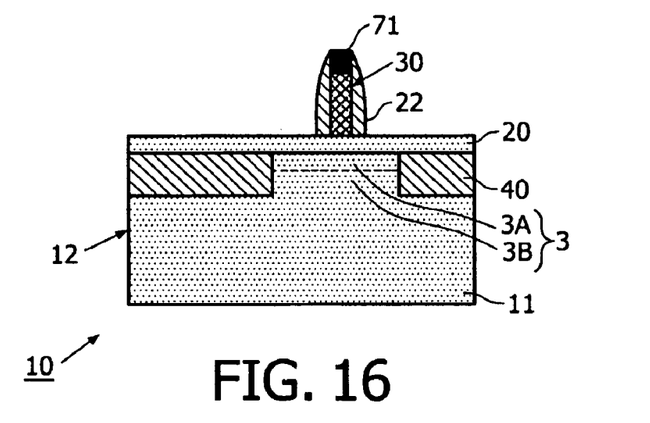
FIG. 16 is a diagrammatic, cross-sectional view, at right angles to the thickness direction of FIG. 15, of a first successive stage of the manufacturing process by means of a second embodiment of a method in accordance with the invention.
Figure 17:
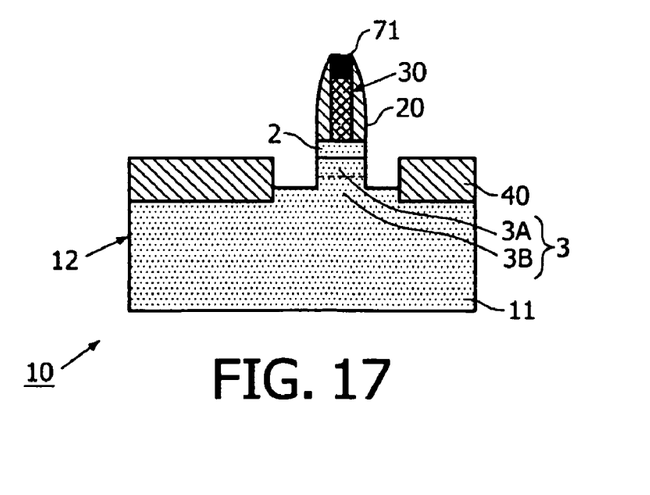
FIG. 17 is a diagrammatic, cross-sectional view, at right angles to the thickness direction of FIG. 15, of a successive stage, after the stage in FIG. 16, of the manufacturing process by means of a second embodiment of a method in accordance with the invention.
Figure 18:
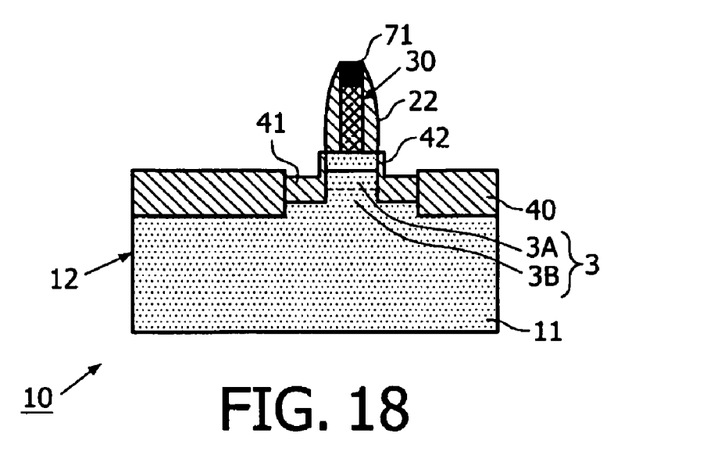
FIG. 18 is a diagrammatic, cross-sectional view, at right angles to the thickness direction of FIG. 15, of a successive stage, after the stage in FIG. 17, of the manufacturing process by means of a second embodiment of a method in accordance with the invention.
Figure 19:
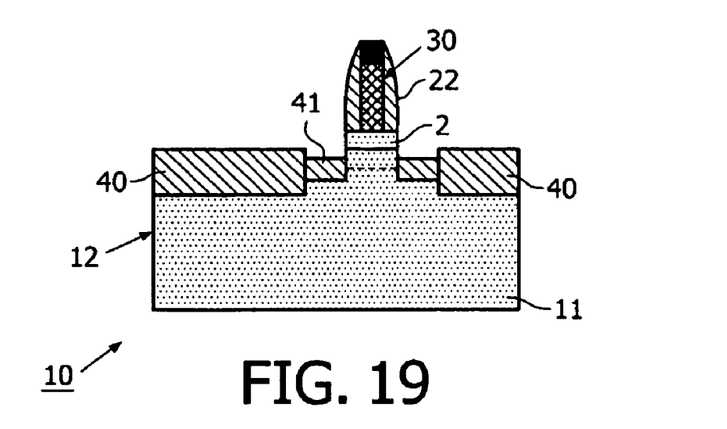
FIG. 19 is a diagrammatic, cross-sectional view, at right angles to the thickness direction of FIG. 15, of a successive stage, after the stage in FIG. 18, of the manufacturing process by means of a second embodiment of a method in accordance with the invention.
Figure 20:
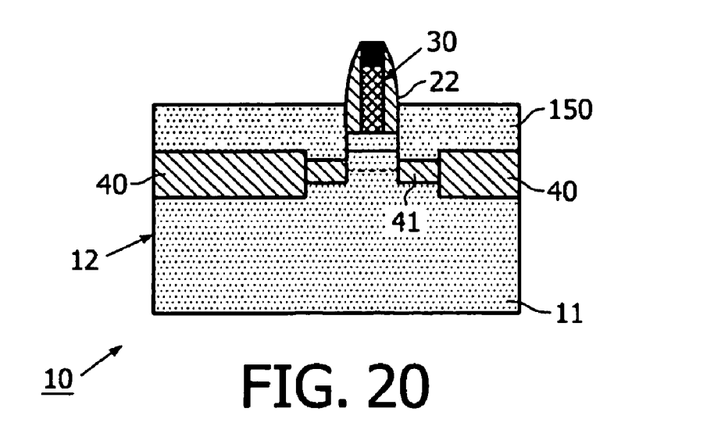
FIG. 20 is a diagrammatic, cross-sectional view, at right angles to the thickness direction of FIG. 15, of a successive stage, after the stage in FIG. 18, of the manufacturing process by means of a second embodiment of a method in accordance with the invention.
Figure 21:
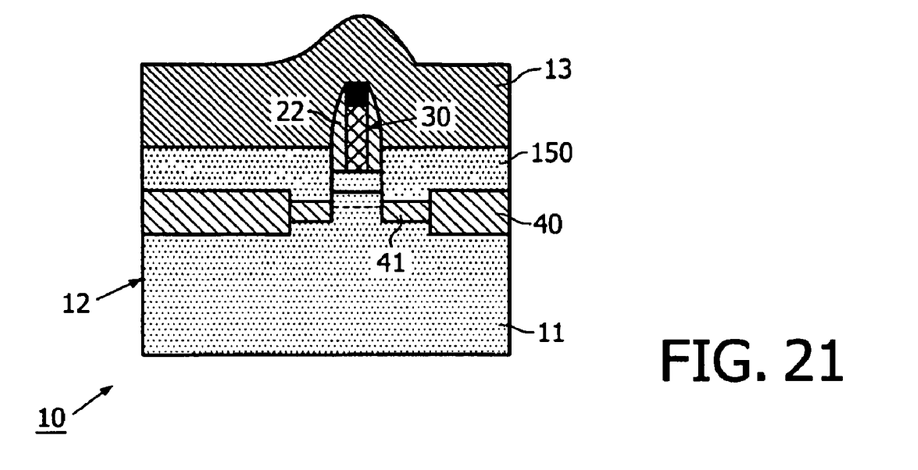
FIG. 21 is a diagrammatic, cross-sectional view, at right angles to the thickness direction of FIG. 15, of a successive stage, after the stage in FIG. 20, of the manufacturing process by means of a second embodiment of a method in accordance with the invention.

FIG. 15 is a diagrammatic cross-sectional view, at right angles to the thickness direction, of a second embodiment of a semiconductor device in accordance with the invention. This is a so-termed self-aligning embodiment of a bipolar npn transistor whose structure corresponds largely to that of the transistor shown in FIG. 1. Similar areas denoted by the same reference numerals will not be separately discussed here. A first difference relates to the structure of the collector region 3 which, in this case, contains a highly doped region 3B and a lightly doped part 3A situated above said region 3B. This structure can also be advantageously applied in the device 10 of the first example. The most important differences relate to the fact that a part of the silicon/SiGe semiconductor body 12 adjacent to the nanowire 30 provided with the spacer 22 has been removed by means of etching. At the locations in question, the semiconductor body 12 is provided with thinner insulation regions 41, which are formed by means of wet thermal oxidation. Above said thinner insulation regions, the side faces of the base region 2 are in direct contact with a highly doped polycrystalline silicon layer 150, which serves as a connection region of the base 2. Besides self-aligning, this embodiment is very compact and extremely suitable for the formation of a transistor with an emitter 1 comprising a larger number of nanowires 30. In FIG. 15, only one such nanowire is shown. This variant can of course also be advantageously applied in a device 10 comprising a large number of individual transistors whose emitter 1 comprises only one or, on the contrary, a larger number of individual nanowires 30.

The device 10 of this example can be manufactured in the following manner, using a second embodiment of a method in accordance with the invention.

FIGS. 16 through 21 are diagrammatic cross-sectional views, at right angles to the thickness direction, of the device of FIG. 15 in successive stages of the manufacturing process by means of a second embodiment of a method in accordance with the invention. Initially, the manufacturing process is conducted in the same way as described above with respect to the first example and as discussed with reference to FIGS. 2 through 8.

Next (see FIG. 16), around the nanowire 30 with droplet-shaped region 71, a spacer 22 as discussed with reference to FIG. 10 is formed.

Subsequently (see FIG. 17), the SiGe layer 20 is entirely removed around the nanowire 30 provided with the spacer 22 by means of etching. Subsequently, an Si-containing part of the semiconductor body 12 is removed, also by means of etching, to beyond the junction between the parts 3A, 3B of the collector 3.

Next (see FIG. 18), the insulation regions 41, 42 are formed by means of a wet thermal oxidation process. In such a wet oxidation process, n+-doped regions have a higher oxidation rate than n- or p or p+-regions, as a result of which the insulation region 42 formed, which covers the flanks of the base 2, is thinner than the insulation region 41 situated at the bottom of the groove formed in the semiconductor body.

By subsequently, (see FIG. 19), subjecting the device 10 for a short period of time to a wet-chemical etch process for silicon dioxide, it is achieved that the surface of the semiconductor body 12 is exposed only on the flanks of the base region 2.

Next (see FIG. 20), a polycrystalline p-type Si layer 150 is provided over the resultant structure, thereby forming a connection region for the base 2. For this purpose, use can be made of, for example, CVD. To form the connection region for the base 2 on the side walls of the base 2, use can alternatively be made of a selective epitaxial growth process.

Figure 12:
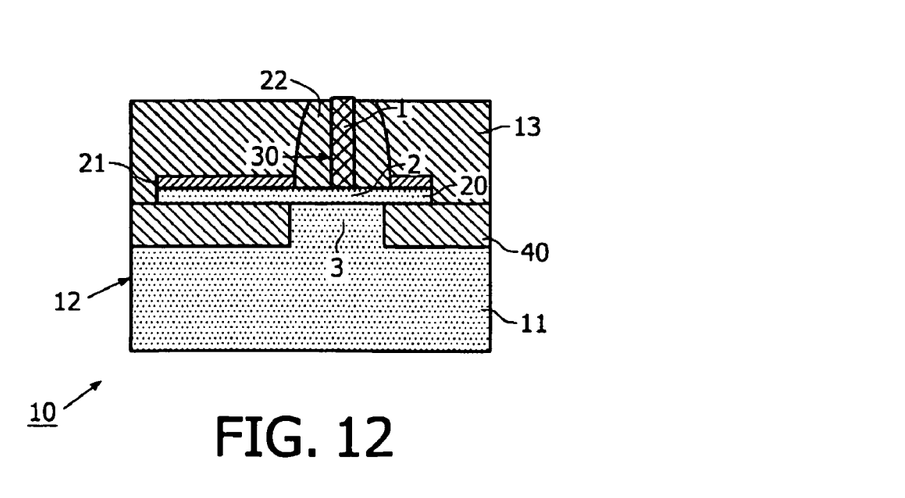
Figure 13:
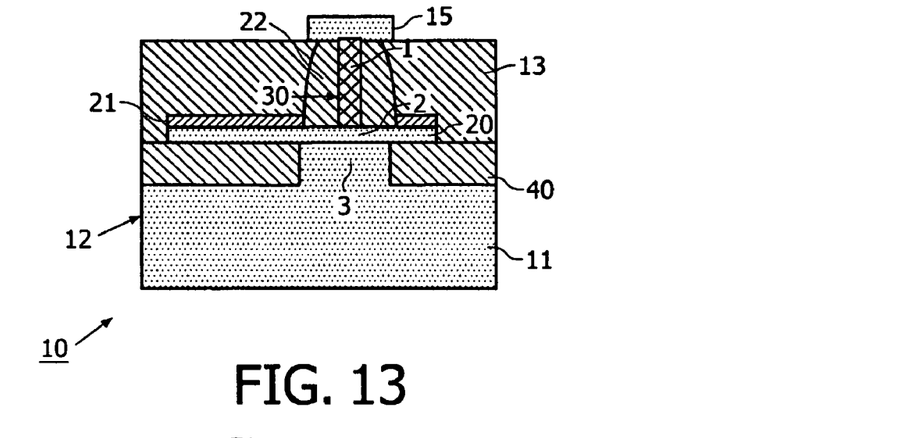

Next (see FIG. 21), a first electrically insulating layer 13 is provided, after which the process steps discussed with respect to FIGS. 12 and 13 are carried out, resulting in the device shown in FIG. 15.

Figure 22A:
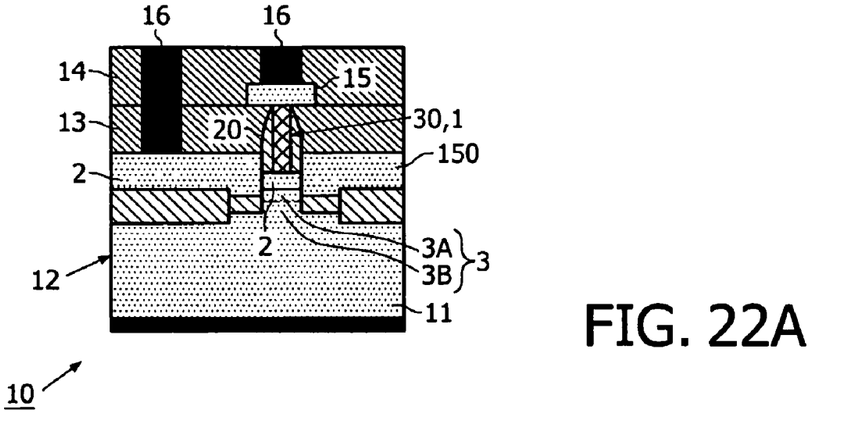
FIG. 22A shows, a normal bipolar transistor in accordance with the invention and corresponding to the device shown in FIG. 15.
Figure 22B:
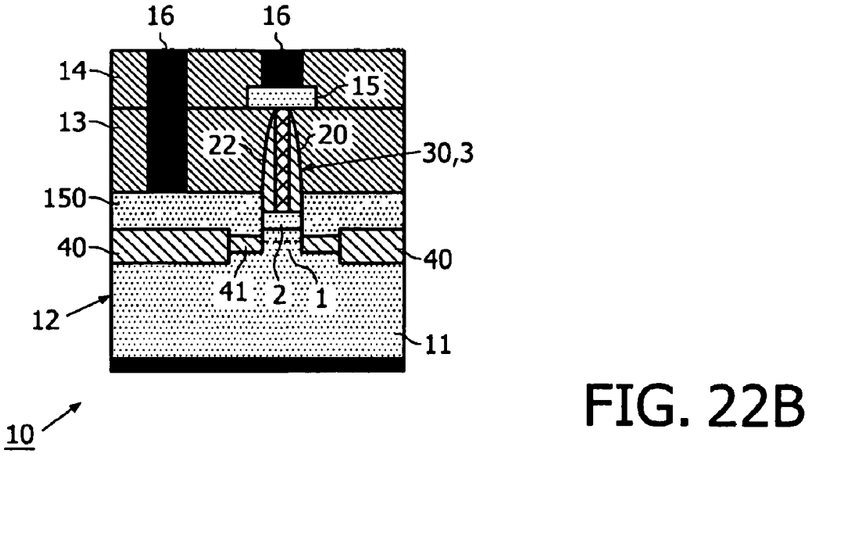
FIG. 22B shows an inverted bipolar transistor in accordance with the invention and corresponding to the device shown in FIG. 15, FIG. 23A diagrammatically shows the variation of the doping concentration in the thickness direction for the transistor shown in FIG. 22A, and FIG. 23B diagrammatically shows the variation of the doping concentration in the thickness direction for the transistor shown in FIG. 22B.

FIGS. 22A and 22B show, respectively, a normal bipolar transistor in accordance with the invention and corresponding to the device shown in FIG. 15, and an inverted bipolar transistor in accordance with the invention which illustrates a third exemplary embodiment.

The most important difference between said two transistors relates to the fact that, in the latter transistor, the emitter region 1 is situated within the semiconductor body 12, between the insulating regions 40, 41, and that the collector region 3 comprises the nanowire 30 formed on the surface. Furthermore, these two bipolar transistors have different dimensions and different doping concentrations.

Figure 23A:
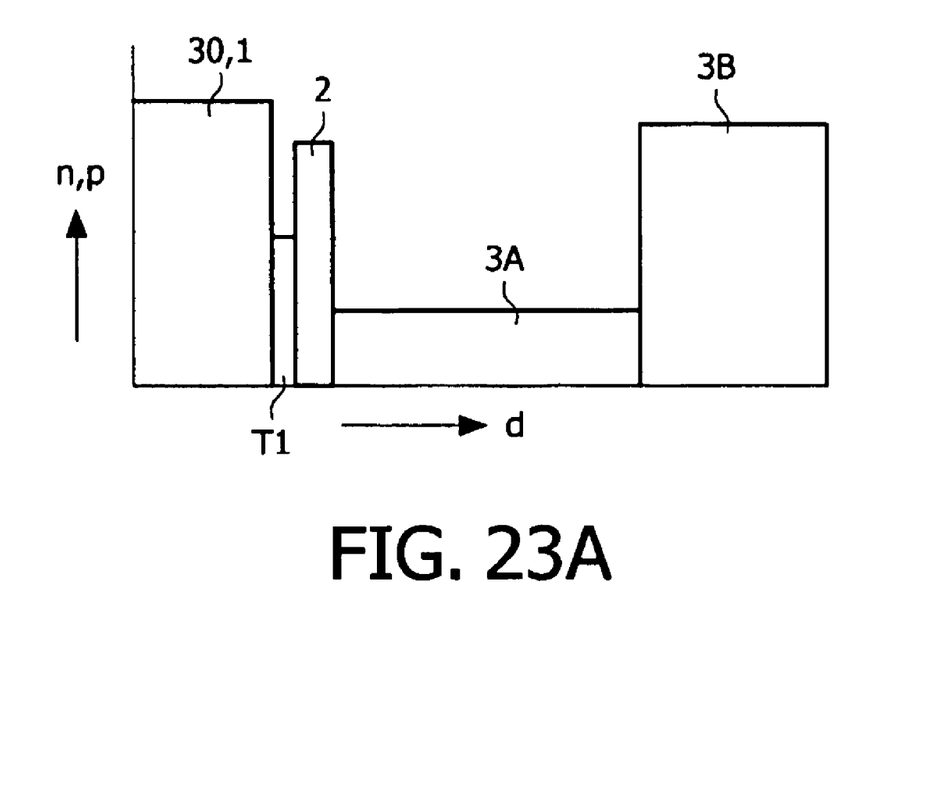
Figure 23B:
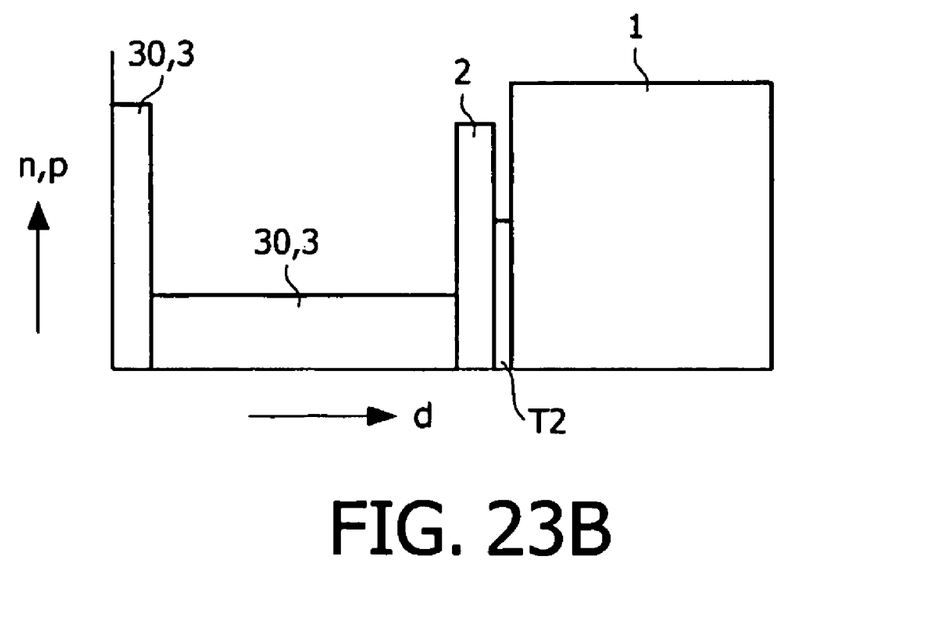

FIGS. 23A and 23B diagrammatically show the variation of the doping concentration n, p in the thickness direction d for the transistor of, respectively, FIG. 22A and FIG. 22B. In said Figures, the various regions are indicated by means of the same reference numerals as in FIG. 22. The regions T1, T2 form lightly doped junction regions, which have not been discussed hereinbefore. The region T1 may be formed in the nanowire 30 or in the subjacent part of the semiconductor body 12. The region T2 is situated in the semiconductor body 12. FIG. 23B clearly shows that the nanowire 30 forming the collector 3 of the inverted bipolar (npn) transistor, comprises a thin, highly doped portion and a thicker, lower-doped portion that borders on the base 2.

The invention is not limited to the exemplary embodiments described herein, and within the scope of the invention many variations and modifications are possible to those skilled in the art. For example, the invention can be applied not only in a bipolar device but also in a Bi(C)MOS (=Bipolar (Complementary) Metal Oxide Semiconductor) IC (=Integrated Circuit). The invention can also be applied to PNP transistors. Besides ICs, the invention can be applied to discrete bipolar transistors.

It is further noted that instead of STI insulation regions, insulation regions can be applied which are obtained by means of the LOCOS (=Local Oxidation Of Silicon) technique. A larger number of nanowires may alternatively be linearly juxtaposed with a small interspace. In this manner, a nanoplane is quasi obtained. If the formed nanowires unite during the formation process, even a true nanoplane is obtained, which extends perpendicularly to the surface of the semiconductor body. Besides a mixed crystal of Si—Ge for the base, also other mixed crystals can be advantageously used, such as a mixed crystal of Si and C or pure Si.

Also for a method in accordance with the invention it applies that many variations and modifications are possible. For example, the highly doped part of the emitter region may alternatively be formed by means of gas-phase doping after removal of the nanowire and prior to filling the nanocavity with a metal. In this case, the method is carried out as follows: after the spacer has been formed around the nanowire, said nanowire can be removed. A junction can now be formed by, for example, diffusion from the gas phase or from another diffusion source, such as phosphor glass or polysilicon. In this case, the nanowire is used only to define the small emitter surface.

Finally, it is noted that, in an attractive variant, a part of the base region may be formed so as to be part of the nanowire. Therefore, in this application, the term "layer-shaped region" is to be taken to mean explicitly a layer-shaped area provided with a protuberance. This variant offers additional advantages. One of the advantages relates to the fact that, in such a case, it is easier to choose a different material for the part of the base region bordering on the emitter than for the other part of the base region wherein the connection region thereof is formed. The small lateral dimensions of the protuberant part of the base region ensure that, if a semiconductor material having a lattice constant which differs from that of the semiconductor body is chosen for said part, this deviation causes fewer problems, such as the development of defects. Besides, the remaining, layer-shaped part of the base region, which then contains a material which deviates less, or not at all, from that of the semiconductor body, may be more suitable to accommodate a connection region with a low-ohmic connection contact.

The invention claimed is:

1. A semiconductor device comprising a semiconductor body with a bipolar transistor comprising an emitter region, a base region and a collector region of, respectively, a first conductivity type, a second conductivity type opposite to the first conductivity type, and the first conductivity type, characterized in that one of the emitter or collector regions comprises a nanowire the base region is formed at the surface of the semiconductor body by means of a layer-shaped region the other one of the emitter or collector regions is formed in the semiconductor body below the base region and the emitter or collector region comprising the nanowire is provided on the surface of the semiconductor body in such a manner that the longitudinal axis thereof extends perpendicularly to the surface of the semiconductor body.

2. A semiconductor device as claimed in claim 1, characterized in that the base region comprises an epitaxial layer containing a mixed crystal of silicon and germanium.

3. A semiconductor device as claimed claim 1, characterized in that the nanowire is formed by means of selective epitaxy.

4. A semiconductor device as claimed in claim 1, characterized in that the nanowire comprises a semiconductor material.

5. A semiconductor device as claimed in claim 4, characterized in that the nanowire comprises a III-V semiconductor material.

6. A semiconductor device as claimed in claim 3, characterized in that the emitter region is formed by means of out-diffusion in the base region of doping atoms present in the nanowire.

7. A semiconductor device as claimed in claim 1, characterized in that the nanowire is provided with a spacer and the base region formed so as to be self-aligning with respect to the nanowire provided with the spacer.

8. A semiconductor device as claimed in claim 1, characterized in that the emitter region comprises the nanowire.

9. A semiconductor device as claimed in claim 8, characterized in that the emitter region comprises a large number of separate nanowires whose end portions, which are removed from the surface of the semiconductor body are interconnected by means of a conductor.

10. A semiconductor device as claimed in claim 1, characterized in that the nanowire comprises a metal.

11. A semiconductor device as claimed in claim 1, characterized in that the collector region comprises the nanowire.

12. A semiconductor device as claimed in claim 1, characterized in that the doping concentration or the composition of the material of the nanowire changes in the longitudinal direction of said wire.

13. A semiconductor device as claimed in claim 1, characterized in that the layer-shaped base region has a protuberance that forms part of the nanowire.

14. A method of manufacturing a semiconductor device with a semiconductor body in which a bipolar transistor is formed comprising an emitter region, a base region and a collector region of, respectively, a first conductivity type, a second conductivity type opposite to the first conductivity type, and the first conductivity type, characterized in that one of the emitter and collector regions is formed by means of a nanowire the base region is formed at the surface of the semiconductor body by means of a layer-shaped region the other one of the emitter and collector regions is formed under the base region in the semiconductor body, and the emitter or collector region formed by means of the nanowire is provided on the surface of the semiconductor body in such a way that its longitudinal axis extends perpendicularly to the surface.

15. A method as claimed in claim 14, characterized in that after the formation of the layer-shaped region by means of which the base region is formed on the surface of the semiconductor body a flat metal region is locally provided which, after melting, form into a droplet-shaped metal region after which the nanowire is grown under the droplet-shaped metal region on the surface of the semiconductor body by means of a gas-phase growth process.

16. A method as claimed in claim 15, characterized in that after the formation of the nanowire said wire is provided with a spacer.

17. A method as claimed in claim 16, characterized in that the nanowire provided with the spacer is buried by means of a first isolating layer after which the structure is planarized, thereby causing the droplet-shaped metal region to be removed.

18. A method as claimed in claim 17, characterized in that a conductive region of larger section than the nanowire is formed on the exposed end portion of the nanowire after which a second isolating layer is applied to the structure and provided with apertures extending as far as the base region after which the conductive region and the apertures are filled using a conductive material.

19. A method as claimed in claim 16, characterized in that, using the nanowire provided with the spacer as a mask, the part of the layer-shaped region situated outside the mask, and used to form the base region is removed by etching.

20. A method as claimed in claim 19, characterized in that, by means of oxidation and etching, the side faces of the base region are exposed, and a surface insulation region present is extended, viewed in projection, as far as the base region by the addition of a further insulation region after which a conductive layer is provided so as to be in contact with the side faces of the base region.

\* \* \* \* \*